(12) United States Patent
Tsui et al.

(10) Patent No.: US 7,637,142 B2
(45) Date of Patent: Dec. 29, 2009

(54) CALIBRATION FOR AUTOMATED MICROASSEMBLY

(75) Inventors: Kenneth Tsui, Richardson, TX (US); Aaron Geisberger, Phoenix, AZ (US)

(73) Assignee: Zyvex Labs, Richardson, TX (US)

( * ) Notice: Subject to any disclaimer, the term of this patent is extended or adjusted under 35 U.S.C. 154(b) by 454 days.

(21) Appl. No.: 11/464,423

(22) Filed: Aug. 14, 2006

(65) Prior Publication Data

US 2007/0012084 A1    Jan. 18, 2007

Related U.S. Application Data

(63) Continuation-in-part of application No. 10/884,904, filed on Jul. 6, 2004, now abandoned.

(60) Provisional application No. 60/583,272, filed on Jun. 25, 2004.

(51) Int. Cl.
*G01B 3/30*        (2006.01)
(52) U.S. Cl. ...................................................... 73/1.79
(58) Field of Classification Search ................. 73/1.75, 73/1.79, 1.81, 1.86; 33/567, 567.1, 556, 33/558, 559, 560, 561
See application file for complete search history.

(56) References Cited

U.S. PATENT DOCUMENTS

| 4,843,866 | A | 7/1989 | Madsen et al. |
| 5,955,668 | A | 9/1999 | Hsu et al. |
| 6,318,146 | B1 | 11/2001 | Madsen et al. |
| 6,635,486 | B2 | 10/2003 | Madsen et al. |

OTHER PUBLICATIONS

Tsui, K. et al., "Calibration Systems and Techniques for Automated Microassembly", 2003 International Electronic Packaging Technical Conferences and Exhibition, ASME, Jul. 6-11, 2003, pp. 1-5.

*Primary Examiner*—Robert R Raevis
(74) *Attorney, Agent, or Firm*—Haynes and Boone LLP

(57) ABSTRACT

An apparatus including a micro-mechanical calibration member having at least a portion that is elastically biasable away from a neutral position in response to mechanical contact. The apparatus may also include a fixed member proximate the micro-mechanical calibration member which may be referenced to automatically detect deflection of the micro-mechanical calibration member away from the neutral position. The micro-mechanical calibration member may also be configured to receive a micro-mechanical contacting member to provide the mechanical contact employed to bias the micro-mechanical calibration member away from the neutral position.

20 Claims, 8 Drawing Sheets

CALIBRATION FOR AUTOMATED MICROASSEMBLY

CROSS-REFERENCE

This application is a continuation-in-part of U.S. patent application Ser. No. 10/884,904, filed Jul. 6, 2004, entitled "CALIBRATION FOR AUTOMATED MICROASSEMBLY," which claims the benefit of U.S. Provisional Application No. 60/583,272, filed Jun. 25, 2004, entitled "CALIBRATION SYSTEM AND TECHNIQUES FOR MICROASSEMBLY," which is hereby incorporated herein by reference in its entirety.

This invention was made with the United States Government support under 70NANB1H3021 awarded by the National Institute of Standards and Technology (NIST). The United States Government has certain rights in the invention.

BACKGROUND

Microstructures assembled perpendicular to the plane of fabrication have unique properties and potential applications within optical and RF devices. Since the planar nature of micromachining prohibits true three-dimensional fabrication, some level of assembly is necessary.

Pick and place assembly is one option for such assembly. Pick and place assembly employs a multiple degree-of-freedom high precision robot using attached micro-mechanical end-effectors to remove assembly components from one location and assemble them in another location. Thus, it is necessary to calibrate the assembly robot to the one or more dies or chips containing the assembly components and the assembly locations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
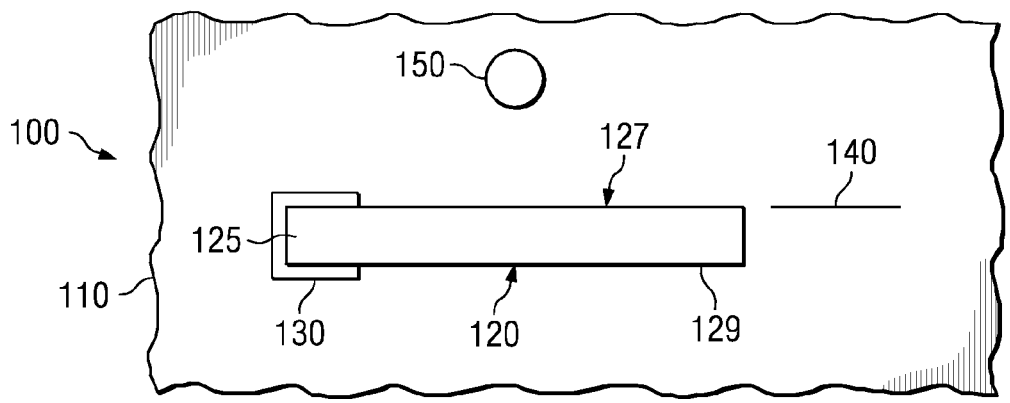
FIG. 1A is a top view of at least a portion of an apparatus according to aspects of the present disclosure.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over, on, or coupled to a second feature in the description that follows may include embodiments in which the first and second features are in direct contact, and may also include embodiments in which additional features interpose the first and second features, such that the first and second features may not be in direct contact.

Referring to FIG. 1A, illustrated is a top view of at least a portion of an apparatus 100 according to aspects of the present disclosure. The apparatus 100 may be integral to, assembled with, or otherwise form at least a portion of a micro-mechanical device. A micro-mechanical device, as used herein, may be or comprise a micro-scale mechanical device, a micro-electronic device, a micro-electro-mechanical device, a micro-electro-mechanical system (MEMS) device, or other micro-scale device, component, or assembly (hereafter collectively referred to as micro-mechanical devices). Micro-mechanical and other micro-scale devices within the scope of the present disclosure may have one or more feature dimensions (e.g., widths of patterned lines or other features) that are less than about 50 microns. For example, the feature dimensions may be less than about 25 microns. Micro-mechanical devices within the scope of the present disclosure may also be or comprise a nano-mechanical device, such as a device, component, or assembly or a nano-electro-mechanical system (NEMS), including those having feature dimensions less than about 1000 nm.

The apparatus 100 may include or be formed on or over a substrate 110. The substrate 110 may comprise a bottommost layer or region of a micro-mechanical device or a component of another device to which the apparatus 100 may be bonded or otherwise coupled. The substrate 110 may comprise at least a portion of a silicon-on-insulator (SOI) substrate, although other substrate types or configurations may also be employed.

The apparatus 100 may be defined from or in one or more layers located over the substrate 110. For example, the apparatus 100 may be defined from a device layer located over the substrate 110, wherein a sacrificial layer may interpose the device layer and the sacrificial layer. Such a device layer may comprise polysilicon and/or other semiconductive materials, and the sacrificial layer may comprise silicon dioxide and/or other electrically insulating materials. An additional layer may also be located over the device layer. One such additional layer may be a feature detection enhancement layer, such as one comprising gold and/or another metal or metal alloy. Each of the above-described layers may be formed by conventional or future-developed processes, and may have individual thicknesses ranging between about 100 nm and about 10,000 nm, although such characteristics are not limited within the scope of the present disclosure. One or more of the above-described layers may also comprise multiple layers.

The apparatus 100 includes a member 120 which may be a micro-mechanical calibration member 120. The micro-mechanical calibration member 120 may be etched, patterned, or otherwise defined in or from one or more of the above-described layers that are located over the substrate 110. For example, the micro-mechanical calibration member 120 may be defined in a device layer separated and/or electrically isolated from the substrate 110 by a sacrificial layer. A portion of the sacrificial layer between the micro-mechanical calibration member 120 and the substrate 110 may be etched or otherwise removed to release a portion of the micro-mechanical calibration member 120 from the substrate. However, a small anchor pad 130 may be protected from the releasing etchant or otherwise maintained, thereby fixing the location of an end 125 of the micro-mechanical calibration member 120 relative to the substrate 110, as indicated in FIG. 1A. Thus, the orientation of at least the end 125 of the micro-mechanical calibration member 120 relative to the substrate 110 may be predetermined or otherwise known. Although illustrated in FIG. 1A as having some boundaries outside the boundaries of the micro-mechanical calibration member 120, one or more of the boundaries of the anchor pad 130 may also be substantially aligned with or fall within one or more of the boundaries of the micro-mechanical calibration member 120.

Also, although illustrated as an elongated member being substantially greater in length than in width, the micro-mechanical calibration member 120 may have other shapes, and may comprise more than one member, section, or portion. For example, the cross-sectional shape and/or area of the micro-mechanical calibration member 120 may vary along its length, and may comprise members or sections having different lengths and/or cross-sectional shapes.

The micro-mechanical calibration member 120 may substantially comprise an elastic or otherwise resilient material, such as polysilicon or other materials, including materials having elastic properties when employed to form micro-scale features, although such materials may not have elastic properties when employed to form macro-scale features. As such, the micro-mechanical calibration member 120 may be biased to or towards a neutral position upon release from the substrate 110. However, the neutral position of the micro-mechanical calibration member 120 may also have an orientation that may be somewhat less linear than as shown in FIG. 1A, such as a skewed or bowed configuration. The dimensions and/or materials of the micro-mechanical calibration member 120 may be adapted to minimize or substantially eliminate such non-linearity, including any non-linearity that may result from internal stresses that may accumulate during fabrication.

In a calibration method according to aspects of the present disclosure, a reference plane, surface, line, spline, or point (hereafter collectively referred to as a reference element) 140 may be established. The reference element 140 may be a linear, two-dimensional element that may be substantially aligned with at least a portion of an edge 127 of the micro-mechanical calibration member 120. The reference element 140 may be recorded or otherwise stored as a positionally fixed datum relative to the substrate 110 and/or to a micro-mechanical end-effector 150. The location of the edge 127 may be obtained by conventional or future-developed edge detection apparatus, software, and techniques, such as the machine vision systems available from NATIONAL INSTRUMENTS of Austin, Tex. The orientation of the reference element 140 relative to the substrate 110 and/or the micro-mechanical end-effector 150, as well as the orientation of the micro-mechanical calibration member 120 relative to the substrate 110 and/or the micro-mechanical end-effector 150, may be or comprise lateral, angular, and zenith positions thereof, and/or other degrees of freedom, each of which may be measured and/or recorded in one or more Cartesian, polar, cylindrical, spherical, and/or circular coordinate systems, among others.

The apparatus 100 and/or its components may have at least one feature dimension other than thickness that is less than about 50 microns. The apparatus 100 and/or its components may alternatively, or additionally, have at least one feature dimension other than thickness that is less than about 25 microns. The apparatus 100 and/or its components may alternatively, or additionally, have at least one feature dimension other than thickness that is less than about 1000 nm.

Figure 1B:
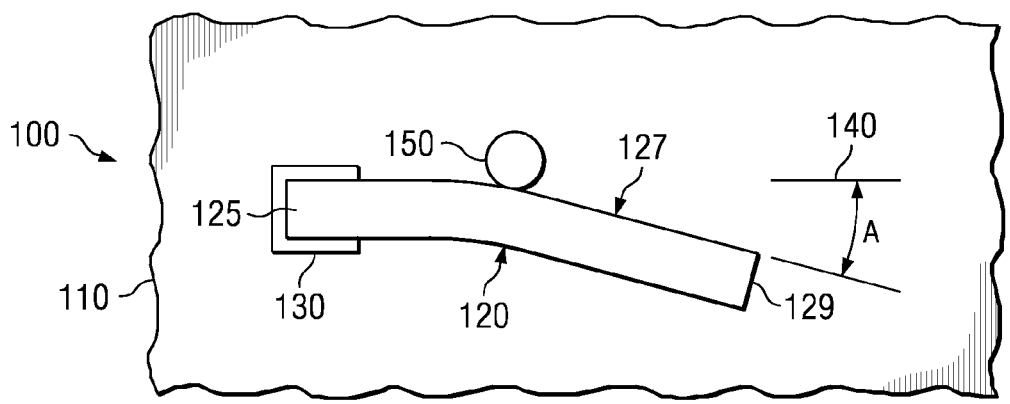
FIG. 1B is a top view of the apparatus shown in FIG. 1A.

Referring to FIG. 1B, illustrated is a top view of the apparatus 100 shown in FIG. 1A after the micro-mechanical end-effector 150 and the micro-mechanical calibration member 120 have been brought into contact with sufficient force to deflect the micro-mechanical calibration member 120. The micro-mechanical end-effector 150 may be or comprise a probe or tip having a rounded, squared, pointed, or other shape. While not limited within the scope of the present disclosure, the dimensions of the micro-mechanical end-effector 150, or at least the portion thereof configured to interface with the micro-mechanical calibration member 120 (e.g., the tip), may range between about 1 µm and about 500 µm. At least the interfacing portion of the micro-mechanical end-effector 150 may comprise silicon, tungsten, electroplated nickel, and/or other materials. The micro-mechanical end-effector 150 may be at least partially robotic or be a component of a robotic system or apparatus, such as an automated positioning or assembly system or apparatus. Micro-mechanical contacting-members and other apparatus other than the micro-mechanical end-effector 150 may also or alternatively be employed to contact and deflect the micro-mechanical calibration member 120 within the scope of the present disclosure. Thus, any description of reference herein to a micro-mechanical end-effector may be application or readily adaptable to other types of micro-mechanical contacting-members.

The force necessary to deflect the micro-mechanical calibration member 120 in response to contact with the micro-mechanical end-effector 150 may range between about 1 µN and about 1000 µN. Such a contact force, which may also be referred to herein as a deflection force, may also or alternatively range between about 10 µN and about 100 µN. The deflection force may also or alternatively be less than about 50 µN, and/or greater than about 5 µN. For example, the contact force may be about 5 µN. The deflection force may also be limited by predetermined constraints within the method or apparatus employing the micro-mechanical calibration member 120. For example, the deflection force may not be allowed to exceed the quotient of the force required to plastically deform the micro-mechanical calibration member 120 divided by a predetermined safety factor, wherein the safety factor may range between about 1.0 and about 10.0. For example, the safety factor may be about 5.0.

The deflection of the micro-mechanical calibration member 120 may be or comprise an angular deflection A of a free end 129 of the micro-mechanical calibration member 120. The angular deflection A may be determined by detecting the location of one or more points on the edge 127 of the micro-mechanical calibration member 120 for comparison with the reference element 140. However, the deflection of the micro-mechanical calibration member 120 may be or comprise a substantially lateral deflection of the free end 129 and/or other portion of the micro-mechanical calibration member 120, wherein such lateral deflection may be substantially parallel to the substrate 110 (e.g., substantially parallel to the page in FIG. 1B). Determining such a lateral deflection may require detecting a fewer number of points than required for determining angular deflection. The deflection of the micro-mechanical calibration member 120 may also comprise both an angular component and a lateral component.

Detecting the deflection of the micro-mechanical calibration member 120 may be performed substantially as described above, such as with a machine vision system. The deflection detection may also be performed continuously, such as to dynamically detect the deflection while the micro-mechanical calibration member 120 is in motion relative to the substrate 110.

Moreover, the deflection force described above may be predetermined based on the desired angular and/or lateral displacement of the micro-mechanical calibration member 120. For example, a minimum contact force of the micro-mechanical end-effector 150 may be maintained in order to achieve the desired displacement of the micro-mechanical end-effector 150 and/or the micro-mechanical calibration member 120 relative to the substrate 110 and/or the reference element 140. The speed and/or total displacement of the micro-mechanical end-effector 150 may be constrained to avoid plastically deforming or otherwise damaging the micro-mechanical calibration member 120. The deflection force may be incrementally or otherwise increased until a desired, minimum, or maximum angular and/or lateral displacement of the micro-mechanical calibration member 120 relative to the reference element 140 is achieved.

Figure 1C:
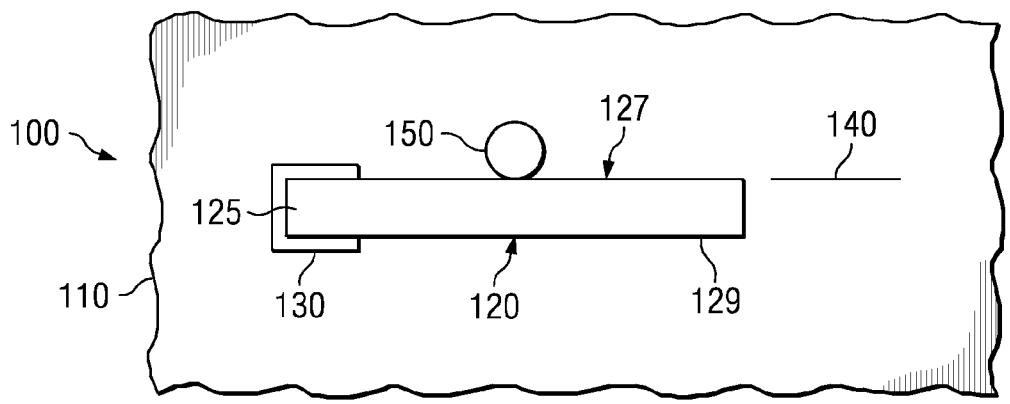
FIG. 1C is a top view of the apparatus shown in FIG. 1B.

Referring to FIG. 1C, illustrated is a top view of at least a portion of the apparatus 100 shown in FIG. 1B after the micro-mechanical calibration member 120 is allowed to return to its neutral position (as shown in FIG. 1A) while maintaining contact between the micro-mechanical calibration member 120 and the micro-mechanical end-effector 150. That is, the deflection of the micro-mechanical calibration member 120 may be decreased to a predetermined amount or to within a predetermined range which may correspond to its neutral position. For example, the deflection of the micro-mechanical calibration member 120 may be decreased to less than or substantially equal to about one micron from, and/or about 0.5 degrees relative to, the reference element 140. Also, the deflection of the micro-mechanical calibration member 120 may be decreased to less than or substantially equal to about 0.05 degrees relative to the reference element 140.

As described above, because the micro-mechanical calibration member 120 may be monolithically or otherwise formed integrally with the substrate 110, the location of the neutral position of the micro-mechanical calibration member 120 relative to the substrate 110 may be substantially predetermined. Consequently, the location of the micro-mechanical end-effector 150 in one degree of freedom relative to the substrate 110 (e.g., relative to one axis of a coordinate system of the substrate 110) can be accurately determined when the micro-mechanical end-effector 150 is contacting the micro-mechanical calibration member 120 and the micro-mechanical calibration member 120 is substantially returned to its neutral position. Locations of the micro-mechanical end-effector 150 in additional degrees of freedom may be determined by performing the above-described method with additional micro-mechanical calibration members integral to or otherwise fixedly positioned relative to the substrate 110 in other orientations. For example, an additional micro-mechanical calibration member may be formed simultaneously with the micro-micro-mechanical calibration member 120 in an orientation that is substantially orthogonal to the micro-mechanical calibration member 120. The additional micro-mechanical calibration member 120 may otherwise be substantially similar to the micro-mechanical calibration member 120.

The above-described aspects of the micro-mechanical calibration member 120 and methods of calibration employing such a feature may be applicable or readily adaptable to other embodiments described below or otherwise within the scope of the present disclosure.

Figure 2A:
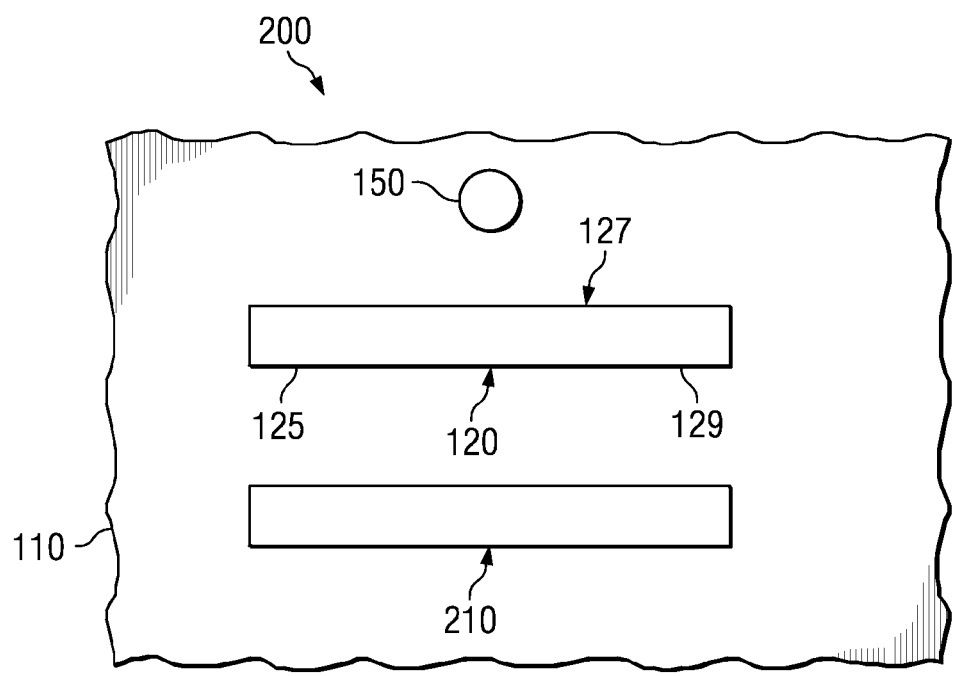
FIG. 2A is a top view of at least a portion of an apparatus according to aspects of the present disclosure.

Referring to FIG. 2A, illustrated is a top view of at least a portion of an apparatus 200 according to aspects of the present disclosure. The apparatus 200 may be integral to, assembled with, or otherwise form at least a portion of a micro-mechanical device. The apparatus 200 may be substantially similar to the apparatus 100 shown in FIGS. 1A-1C. For example, the apparatus 200 includes a micro-mechanical calibration member 120, wherein one end 125 may be fixedly positioned relative to a substrate 110 and another end may be displaceable from a neutral position.

However, the apparatus 200 includes an additional member 210. The additional member 210 may be substantially similar in composition and manufacture to the micro-mechanical calibration member 120. At least a portion of the additional member 210 may be anchored to or otherwise fixedly positioned relative to the substrate 110, such as may result from fabricating the additional member 210 directly on the substrate 110 or a component rigidly secured to the substrate 110. All or a substantial portion of the additional member 210 may be anchored to or otherwise fixed in location relative to the substrate 110. Accordingly, the additional member 210 may be referred to herein as a fixed member 210.

The additional member 210 may serve as a reference for detecting displacement of the micro-mechanical calibration member 120. The displacement of the micro-mechanical calibration member 120 may be detected relative to the reference point 140, which requires an initial position (e.g., the neutral position) of the micro-mechanical calibration member 120 to be detected for subsequent reference. However, employing the additional member 210 allows the detection of displacement of the micro-mechanical calibration member 120 relative to a physical reference, as demonstrated in FIG. 2B.

The apparatus 200 and/or its components may have at least one feature dimension other than thickness that is less than about 50 microns. The apparatus 200 and/or its components may alternatively, or additionally, have at least one feature dimension other than thickness that is less than about 25 microns. The apparatus 200 and/or its components may alternatively, or additionally, have at least one feature dimension other than thickness that is less than about 1000 nm.

Figure 2B:
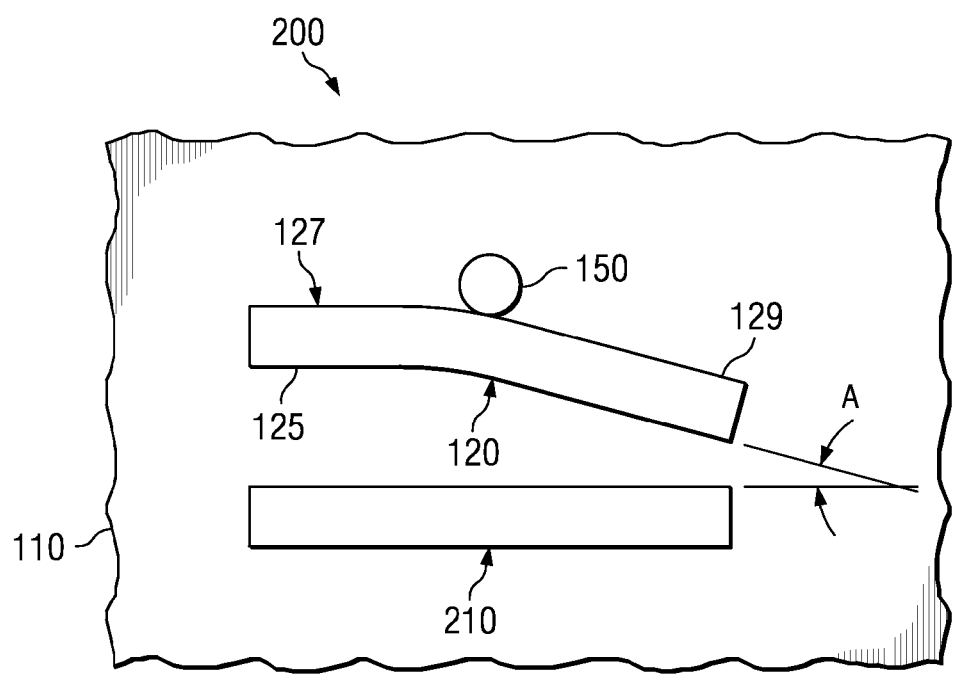
FIG. 2B is a top view of the apparatus shown in FIG. 2A.

Referring to FIG. 2B, illustrated is a top view of the apparatus 200 shown in FIG. 2A after the micro-mechanical end-effector 150 has been translated toward the micro-mechanical calibration member 120 to the extent that the micro-mechanical calibration member 120 is deflected from its neutral position by angle A. To determine the location of the micro-mechanical end-effector 150 relative to the substrate 110, the micro-mechanical end-effector 150 may be translated in the opposite direction to reduce the deflection from the angle A to a lesser, predetermined angle. For example, the translation of the micro-mechanical end-effector 150 in the opposite direction may be sufficient to allow the displacement of the micro-mechanical calibration member 120 to return to a state of substantially no deflection, such that the micro-mechanical calibration member 120 may substantially return to its neutral position, while contact between the micro-mechanical calibration member 120 and the micro-mechanical end-effector 150 may be maintained.

Figure 3A:
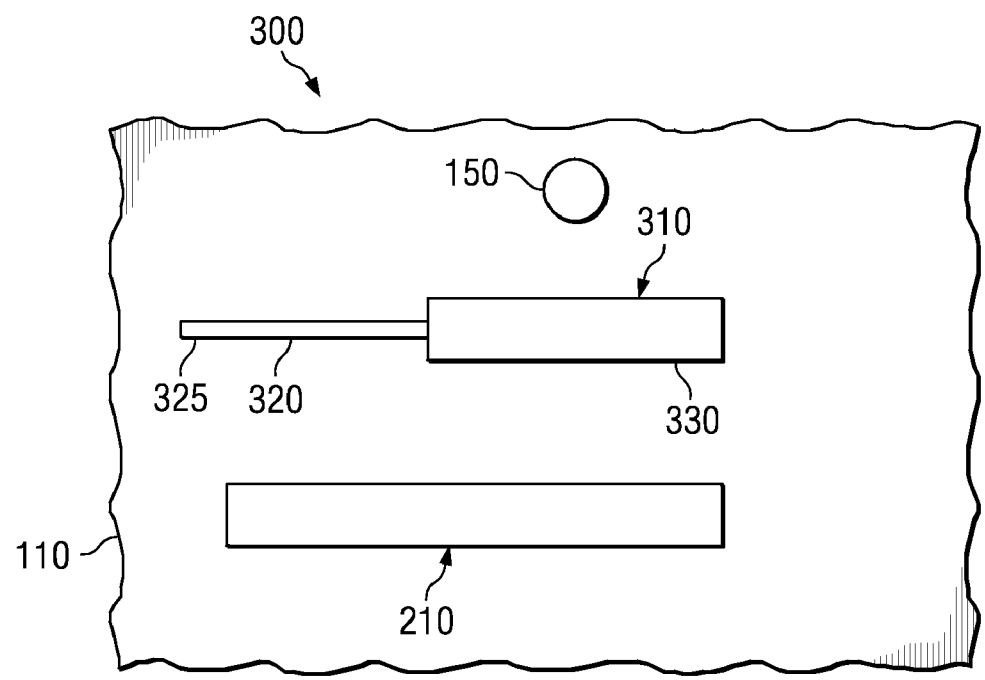
FIG. 3A is a top view of at least a portion of an apparatus according to aspects of the present disclosure.

Referring to FIG. 3A, illustrated is a top view of at least a portion of an apparatus 300 according to aspects of the present disclosure. The apparatus 300 may be integral to, assembled with, or otherwise form at least a portion of a micro-mechanical device. The apparatus 300 may be substantially similar to the apparatus 200 shown in FIGS. 2A and 2B. For example, the apparatus 200 includes a fixed member 210 at least partially fixed in position relative to a substrate 110.

The apparatus 300 also includes a micro-mechanical calibration member 310 having a biasable member 320 and a displaceable member 330 integral to or otherwise coupled to the biasable member 320. The biasable member 320 and the displaceable member 330 may each be substantially similar in composition and manufacture to the micro-mechanical calibration member 120 described above. However, the biasable member 320 may be configured to deform a greater amount than the displaceable member 330 when mechanically biased. The biasable member 320 and the displaceable member 330 may each be elongated members, although the biasable member 320 may have a thinner cross-section in the intended direction of deflection. Thus, the biasable member 320 may substantially be or comprise a spring or spring-like element, or otherwise be resilient or comprise a resilient portion, whereas the displaceable member 330 may be substantially more rigid or inflexible, at least relative to the biasable member 320. Moreover, the geometries of the biasable member 320 and the displacement member 330 may vary from those shown in FIG. 3A. For example, the biasable member 320 may be or comprise a number of substantially concentric or spiral arcuate portions, such as in a coiled configuration.

An end 325 of the biasable member 320 may be fixedly positioned relative to the substrate 110, whereas the displaceable member 330 may be substantially released from the substrate 110 to allow displacement relative to the substrate 110 in response to contact with the micro-mechanical end-effector 150. Thus, the displaceable member 330 may be angularly and laterally displaceable from the neutral position shown in FIG. 3A.

The apparatus 300 and/or its components may have at least one feature dimension other than thickness that is less than about 50 microns. The apparatus 300 and/or its components may alternatively, or additionally, have at least one feature dimension other than thickness that is less than about 25 microns. The apparatus 300 and/or its components may alternatively, or additionally, have at least one feature dimension other than thickness that is less than about 1000 nm.

Figure 3B:
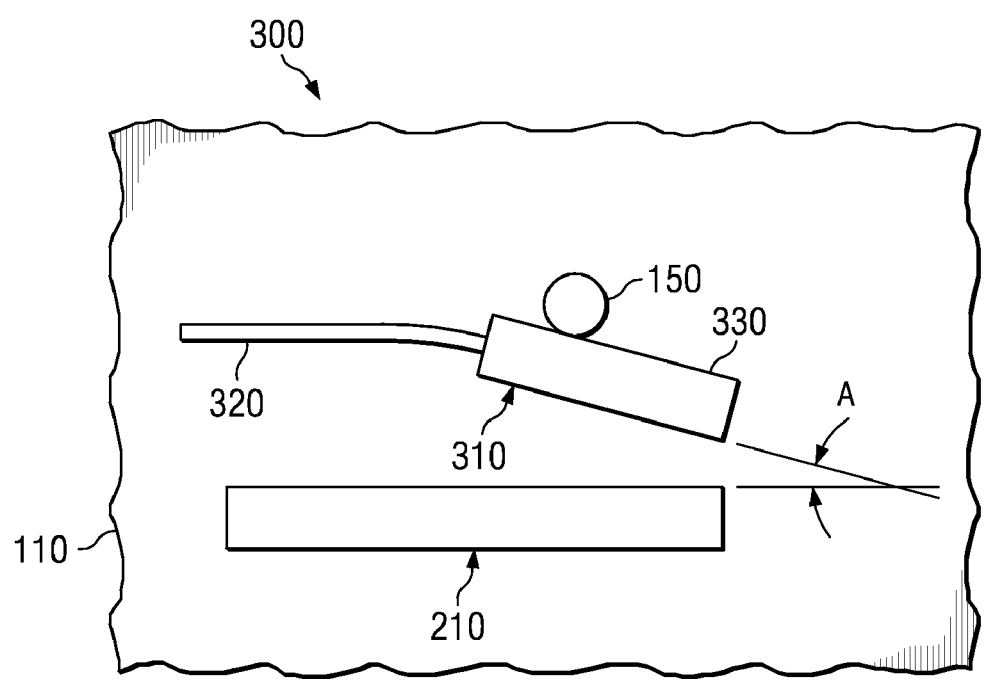
FIG. 3B is a top view of the apparatus shown in FIG. 3A.

Referring to FIG. 3B, illustrated is a top view of the apparatus 300 shown in FIG. 3A after the micro-mechanical calibration member 310 has been displaced in response to contact with the micro-mechanical end-effector 150. The displacement of the micro-mechanical calibration member 310 relative to the substrate 110 may be detected by comparing the angular deflection A between the fixed member 210 and the displaceable member 330 or other portion of the micro-mechanical calibration member 310. Such detection may be edge detection that may be determinable by conventional or future-developed edge-detection apparatus and methods, as described above. The deformation of the micro-mechanical calibration member 310 may also be detected relative to a previously detected and stored neutral position, as described above with reference to FIGS. 1A-1C.

Figure 4A:
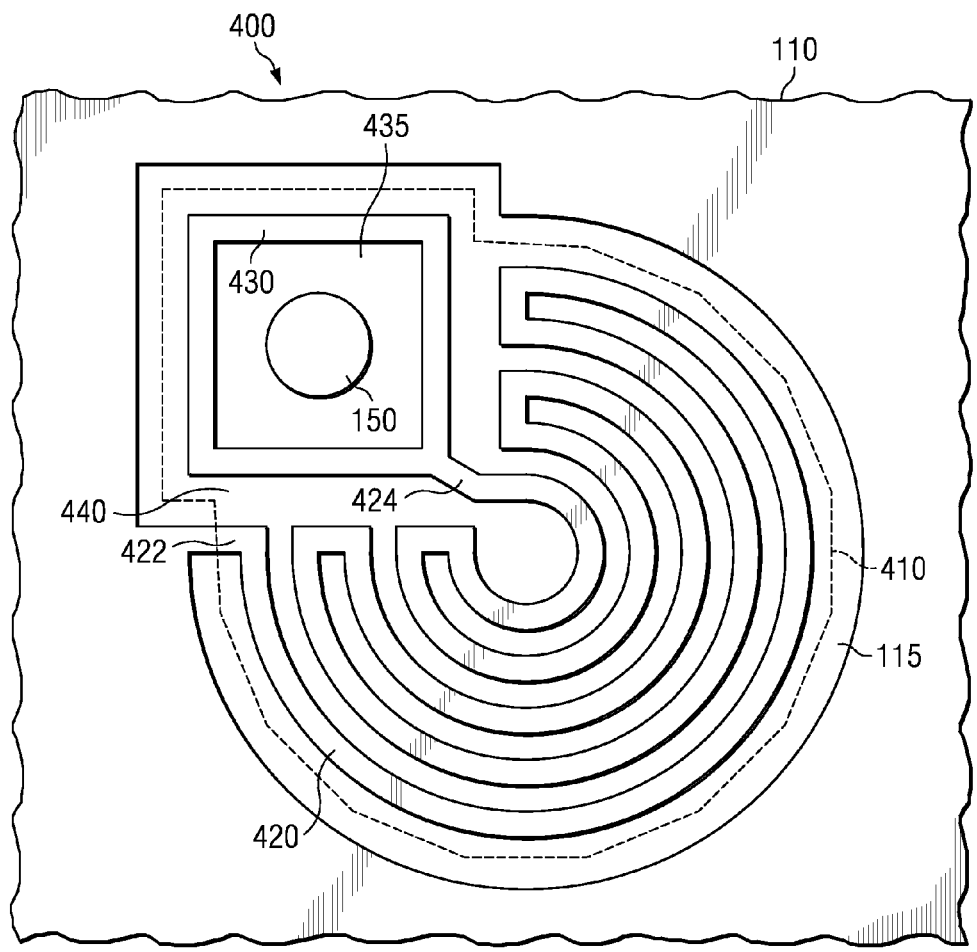
FIG. 4A is a top view of at least a portion of an apparatus according to aspects of the present disclosure.

Referring to FIG. 4A, illustrated is a top view of at least a portion of an apparatus 400 according to aspects of the present disclosure. The apparatus 400 may be integral to, assembled with, or otherwise form at least a portion of a micro-mechanical device. The apparatus 400 may be substantially similar to the apparatus 300 shown in FIGS. 3A and 3B. For example, the apparatus 400 includes a micro-mechanical calibration member 410 having a biasing member 420 and a displaceable member 430, each of which may be formed by patterning one or more layers formed over a substrate 110 and subsequently releasing at least portions of the members by etching or otherwise removing portions of a sacrificial layer interposing the members and the substrate 110.

The biasable member 420 comprises a number of substantially concentric coils connected end-to-end, and is coupled at one end 422 to the substrate 110 (or a member coupled to or otherwise fixedly positioned relative to the substrate 110), and is coupled at another end 424 to the displaceable member 430. The substrate 110 may also include a recess 115 to prevent physical contact between the biasable member 420 and surrounding portions of the apparatus 400 and, thereby, allow movement of the biasable member 420. For example, the substrate 110 may comprise a device layer as described above with reference to FIGS. 1A-1C, wherein the biasable member 420 (and the displaceable member 430) may be defined by removing portions of the device layer, including removing a portion to form the recess 115 sufficient to allow movement of the biasable member 420 without contacting other portions of the device layer.

The displaceable member 430 is configured to receive a micro-mechanical end-effector 150. For example, the displaceable member 430 may include a recess 435 having lateral dimensions that are substantially similar or slightly larger (e.g., at least about 10% larger) than lateral dimensions of the micro-mechanical end-effector 150. However, the recess 435 may be substantially larger than the micro-mechanical end-effector 150. For example, the micro-mechanical end-effector 150 may have a diameter of about 75 μm and the recess 435 may have lateral dimensions of about 250 μm. However, the present disclosure may not be limiting with respect to the size of shape of either the micro-mechanical end-effector 150 or the recess 435. The recess 435 may also extend through the device layer in which it is defined, such that the recess 435 may be an aperture or opening.

The recess or opening 435 also may not be confined on all sides by a portion of the displaceable member 430. That is, in contrast to the closed, four-sided configuration shown in FIG. 4A, the displaceable member 430 may have a three-sided or other open configuration, possibly having a substantially U-shaped profile. The displaceable member 430 may also have a two-sided configuration, possibly having a substantially L-shaped profile. However, many other shapes may be employed for the displaceable member 430 to allow it to be configured to receive the micro-mechanical end-effector 150 within the scope of the present disclosure. The displaceable member 430 may have a four-sided configuration, wherein the internal edge of each of the four sides may be substantially orthogonal to its neighboring sides, such that the recess or opening 435 may have a substantially rectangular shape.

A recess 440 may also be formed substantially around the displaceable member 430 to allow movement of the displaceable member 430 relative to the substrate 110. The recess 440 may have a shape substantially conforming to the outer edges of the displaceable member 430. The recess 440 may otherwise be substantially similar to the recess 115 and/or the recess 435.

The apparatus 400 and/or its components may have at least one feature dimension other than thickness that is less than about 50 microns. The apparatus 400 and/or its components may alternatively, or additionally, have at least one feature dimension other than thickness that is less than about 25 microns. The apparatus 400 and/or its components may alternatively, or additionally, have at least one feature dimension other than thickness that is less than about 1000 nm.

Figure 4B:
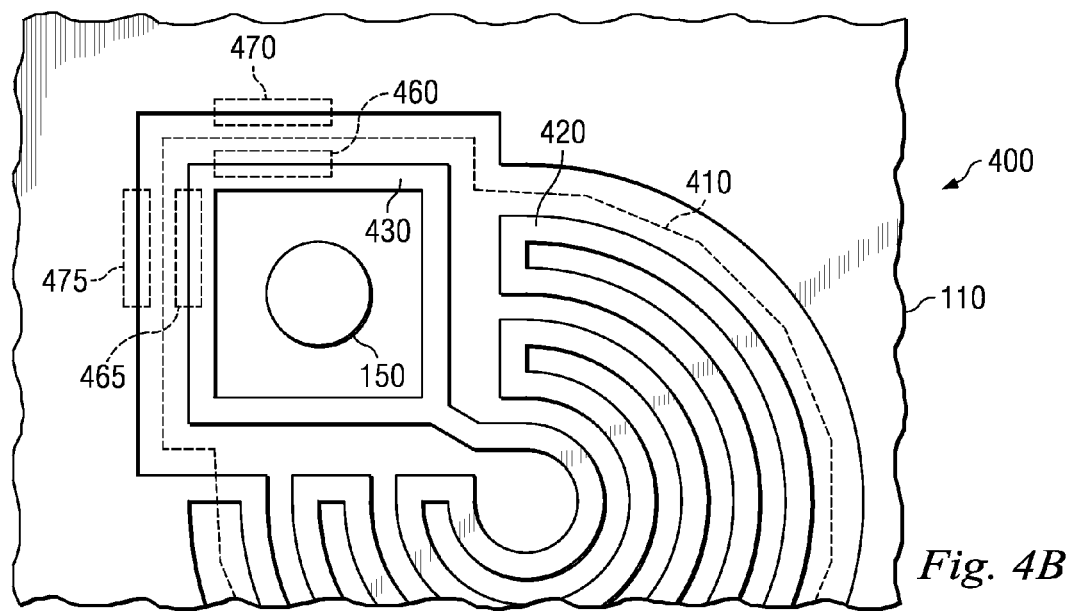
FIG. 4B is a top view of the apparatus shown in FIG. 4A.

Referring to FIG. 4B, illustrated is a detailed view of a portion of the apparatus 400 shown in FIG. 4A. Conventional and/or future-developed feature detection apparatus and methods may be employed to detect one or more edges or other features of the micro-mechanical calibration member 410 and the substrate 110.

An edge or edge portion (hereafter collectively referred to as an edge) 460 of the micro-mechanical calibration member 410 may be detected for comparison with an edge 470 of the substrate 110, and/or an edge 465 of the micro-mechanical calibration member 410 may be detected for comparison with an edge 475 of the substrate 110. The edges 460 and 470 may be substantially parallel when the micro-mechanical calibration member 410 is substantially in its neutral position. However, such parallelism is not necessarily a characteristic of all embodiments within the scope of the present disclosure. For example, the angular relation between the edges 460 and 470 when the micro-mechanical calibration member 410 is in its neutral position may be detected for subsequent comparison during calibration, whether or not the edges 460 and 470 are substantially parallel when the micro-mechanical calibration member 410 is in its neutral position. The edges 465 and 475 may also be substantially parallel when the micro-mechanical calibration member 410 is in its neutral position, and each may also be substantially perpendicular to the one or both of the edges 460 and 470.

Figure 4C:
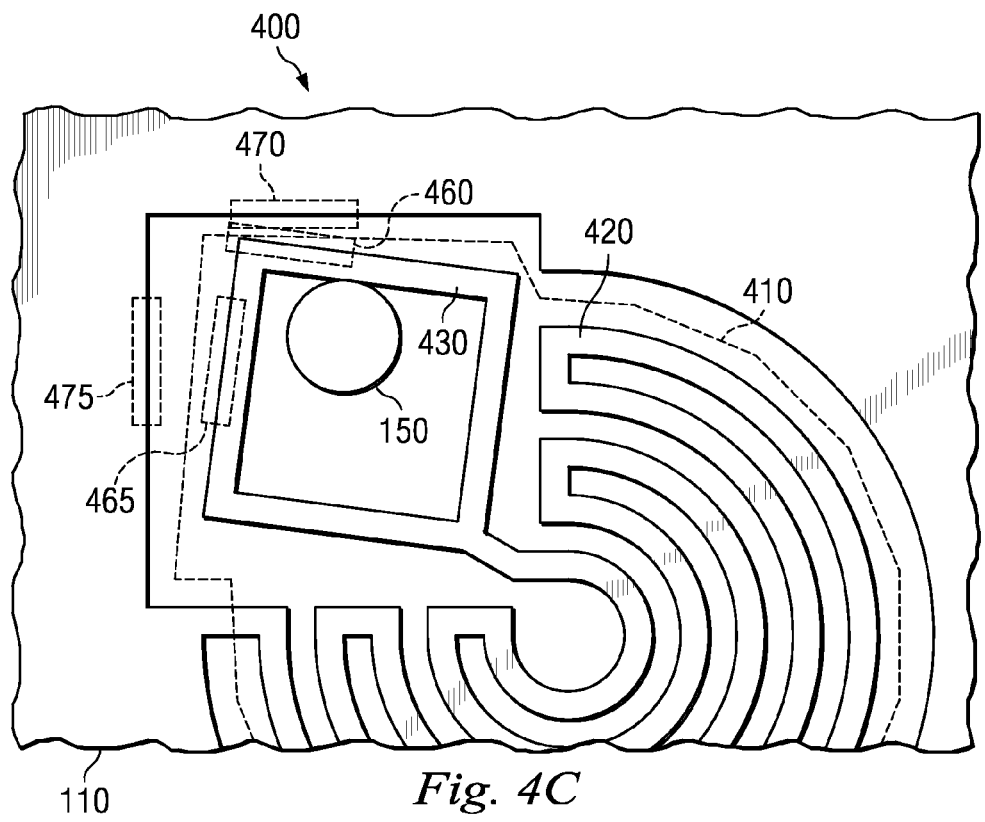
FIG. 4C is a top view of the apparatus shown in FIG. 4B.

Referring to FIG. 4C, illustrated is a top view of the apparatus 400 shown in FIG. 4B after the micro-mechanical end-effector 150 has been translated, such that the micro-mechanical calibration member 410 has been displaced relative to the substrate 110 in response to contact with the micro-mechanical end-effector 150. During such displacement, and/or after such displacement, the relative orientations of the edges 460 and 470 and/or the relative orientations of the edges 465 and 475 may be detected. For example, the angular and/or lateral offset between the edges 460 and 470 and/or the edges 465 and 475 may be detected.

Figure 4D:
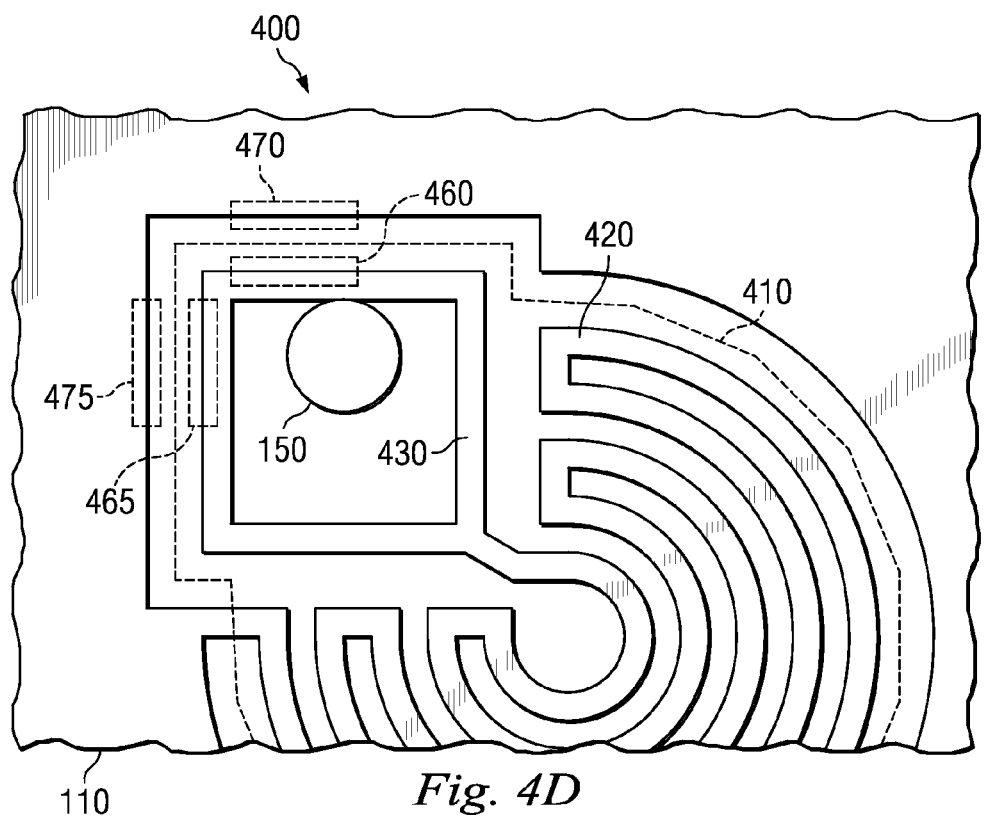
FIG. 4D is a top view of the apparatus shown in FIG. 4C.

Referring to FIG. 4D, illustrated is a top view of the apparatus 400 shown in FIG. 4C after the micro-mechanical end-effector 150 has been translated in a substantially opposite direction from the translation represented in FIG. 4C. For example, the translation of the micro-mechanical end-effector 150 from the position shown in FIG. 4B to the position shown in FIG. 4C may be in a first direction that may be a primary direction of a coordinate system of the micro-mechanical end-effector 150 and/or substrate 110, such as in a direction aligned with the x-axis of such a coordinate system if it is a Cartesian coordinate system. Thereafter, the translation of the micro-mechanical end-effector 150 from the position shown in FIG. 4C to the position shown in FIG. 4D may be in a second direction that is substantially antiparallel to the first direction.

During the translation of the micro-mechanical end-effector 150 towards the position shown in FIG. 4D, the relative orientation of the edges 460 and 470, and/or of the edges 465 and 475, may be detected continuously or at predetermined time intervals. The translation of the micro-mechanical end-effector to or toward the position shown in FIG. 4D may be halted once a predetermined relative orientation of the edges 460 and 470, and/or of the edges 465 and 475, is achieved. This predetermined relative orientation may correspond to the micro-mechanical calibration member 410 substantially returning to its neutral position. The predetermined relative orientation may also or alternatively correspond to the edges 460 and 470, and/or the edges 465 and 475, being substantially parallel.

Because the micro-mechanical end-effector 150 is contacting the micro-mechanical calibration member 410 when the micro-mechanical calibration member 410 is in a known position, such as its neutral position, the location of the micro-mechanical end-effector 150 may be determined. The location of the micro-mechanical end-effector 150 relative to the substrate 110 may thus be noted, and possibly stored, for subsequent use.

This process of contacting the micro-mechanical calibration member 410 and the micro-mechanical end-effector 150 to displace the micro-mechanical calibration member 410 from its neutral position relative to the substrate 110 and subsequently decreasing the displacement of the micro-mechanical calibration member 410 relative to the substrate 110 may then be repeated with translation of the micro-mechanical end-effector 150 in another direction angularly offset from the first and/or second directions described above. For example, the process may be repeated and employ translation of the micro-mechanical end-effector 150 in directions substantially perpendicular to the first and/or second directions, such as in directions substantially aligned with a second primary axis of the coordinate system of the substrate 110 and/or the micro-mechanical end-effector 150. Consequently, the lateral position of the micro-mechanical end-effector 150 relative to the substrate 110 in more than one degree of freedom may be determined.

Figure 5:
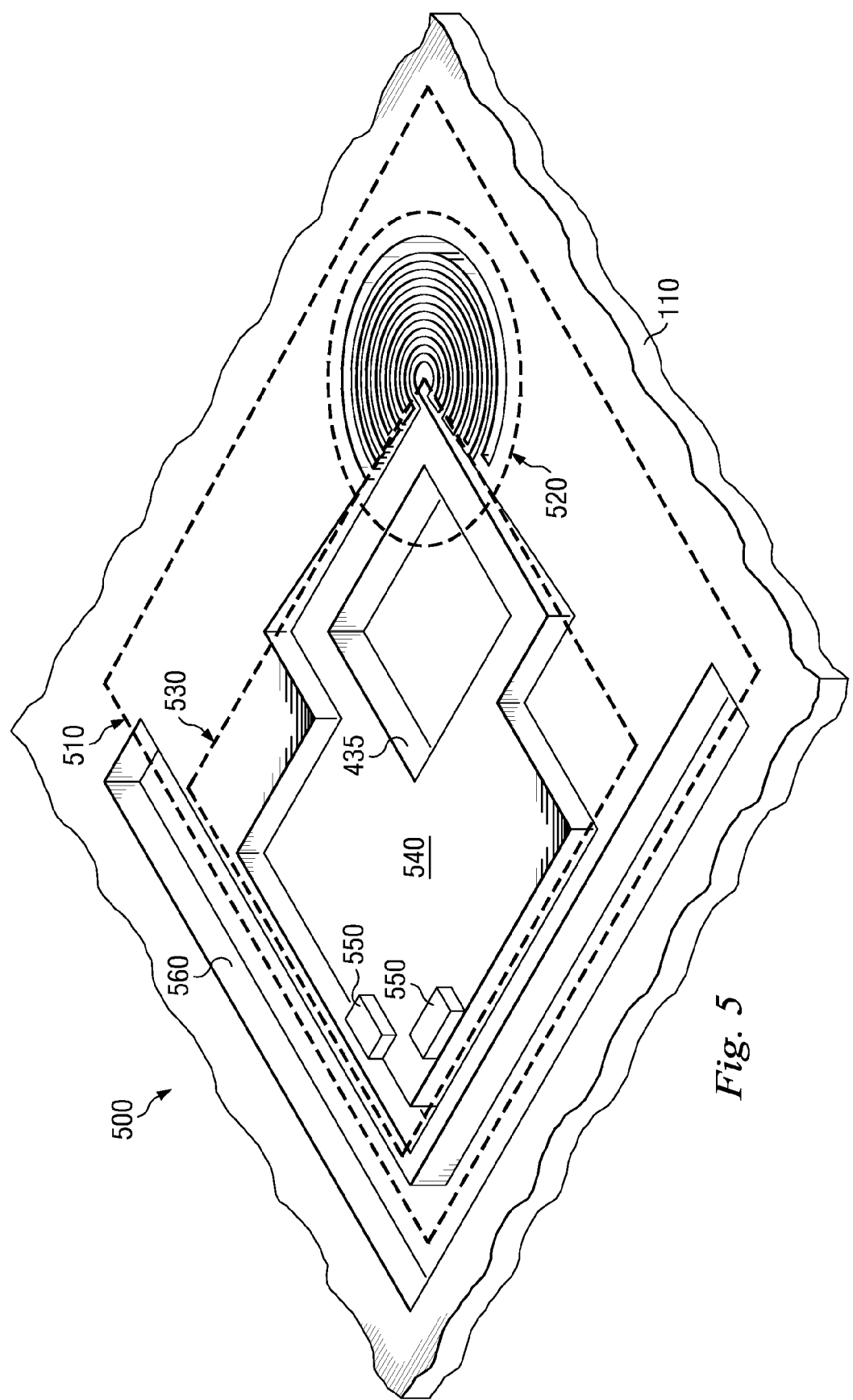
FIG. 5 is a perspective view of at least a portion of an apparatus according to aspects of the present disclosure.

Referring to FIG. 5, illustrated is a perspective view of at least a portion of an apparatus 500 according to aspects of the present disclosure. The apparatus 500 may be integral to, assembled with, or otherwise form at least a portion of a micro-mechanical device. The apparatus is substantially similar to the apparatus 400 shown in FIGS. 4A-4D. For example, the apparatus 500 includes a micro-mechanical calibration member 510 that may be substantially similar to the micro-mechanical calibration member 410, at least in that the micro-mechanical calibration member 510 includes a biasable member 520 that is substantially similar to the biasable member 420.

The apparatus 500 and/or its components may have at least one feature dimension other than thickness that is less than about 50 microns. The apparatus 500 and/or its components may alternatively, or additionally, have at least one feature dimension other than thickness that is less than about 25 microns. The apparatus 500 and/or its components may alternatively, or additionally, have at least one feature dimension other than thickness that is less than about 1000 nm.

The micro-mechanical calibration member 510 also includes a displaceable member 530 that may be substantially similar to the displaceable member 430 shown in FIGS. 4A-4D. For example, each of the displaceable members 430, 530 include an aperture 435 configured to receive a micro-mechanical end-effector and are movably coupled to the substrate 110 by the biasable member 420, 520, respectively. However, the displaceable member 530 also includes a substantially larger solid portion 540. The micro-mechanical calibration member 510 may also include one or more feature detection enhancement elements 550 formed on or otherwise coupled to the portion 540 or other portion of the displaceable member 530. The enhancement elements 550 may each comprise patterned portions of a layer comprising gold or other materials which may aid conventional and/or future-developed feature detection apparatus in detecting the edges or other features of the displaceable member 530.

Other types of feature detection enhancement elements may also be included in the apparatus 500. In the illustrated example, the apparatus 500 includes enhancement elements 560 substantially comprising a recess, trench, or aperture into or through the layer from which the micro-mechanical calibration member 510 is defined.

Figure 6A:
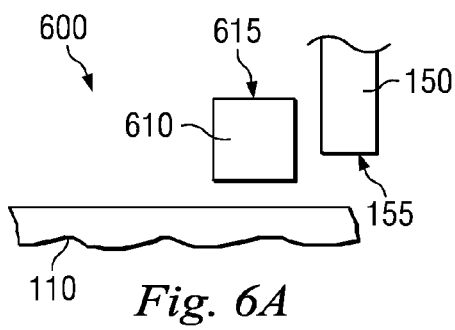
FIG. 6A is a side view of at least a portion of an apparatus according to aspects of the present disclosure.

Referring to FIG. 6A, illustrated is a side view of at least a portion of an apparatus 600 according to aspects of the present disclosure. The apparatus 600 may be integral to, assembled with, or otherwise form at least a portion of a micro-mechanical device. The apparatus 600 includes a micro-mechanical calibration member 610 located over a substrate 110, wherein the micro-mechanical calibration member 610 is displaceable relative to the substrate 110 in response to contact with a micro-mechanical end effector 150. The micro-mechanical calibration member 610 may be substantially similar to one or more of the micro-mechanical calibration members 120, 310, 410, and 510 described above.

The apparatus 600 and/or its components may have at least one feature dimension other than thickness that is less than about 50 microns. The apparatus 600 and/or its components may alternatively, or additionally, have at least one feature dimension other than thickness that is less than about 25 microns. The apparatus 600 and/or its components may alternatively, or additionally, have at least one feature dimension other than thickness that is less than about 1000 nm.

In FIG. 6A, the micro-mechanical end-effector 150 is initially positioned proximate the micro-mechanical calibration member 610 such that the tip 155 of the micro-mechanical end-effector 150 is below the upper edge 615 of the micro-mechanical calibration member 610 relative to the substrate 110. Such positioning may include positioning the micro-mechanical end-effector 150 within a recess or aperture in the micro-mechanical calibration member 610. However, the micro-mechanical calibration member 610 is illustrated in FIG. 6A as a single, elongated, resilient member, such as shown in FIGS. 1A-1C, such that initial positioning of the micro-mechanical end-effector 150 may merely comprise placing the micro-mechanical end-effector 150 laterally proximate the micro-mechanical calibration member 610.

Figure 6B:
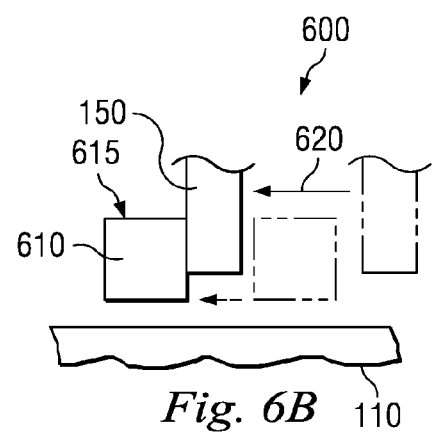
FIG. 6B is a side view of the apparatus shown in FIG. 6A.

Referring to FIG. 6B, illustrated is a sectional view of the apparatus 600 shown in FIG. 6A after the micro-mechanical end-effector 150 is translated in a first direction 620 relative to the substrate 110. The first direction 620 may be substantially parallel to the substrate 110, and may be substantially aligned with a primary axis of a coordinate system corresponding to the micro-mechanical end-effector 150 or its controlling system.

The micro-mechanical calibration member 610 is displaced relative to the substrate 110 in response to the contact with the micro-mechanical calibration member 150. The displacement of the micro-mechanical calibration member 610 may be detected by feature detection apparatus and methods which may be similar to those described above. Such detection may also include detecting the location of features that are stationary relative to the substrate 110 for comparison to the changing location of the micro-mechanical calibration member 610. The detection of displacement of the micro-mechanical calibration member 610 indicates that the tip 155 of the micro-mechanical end-effector 150 is indeed below the upper edge 615 of the micro-mechanical calibration member 610 relative to the substrate 110.

Figure 6C:
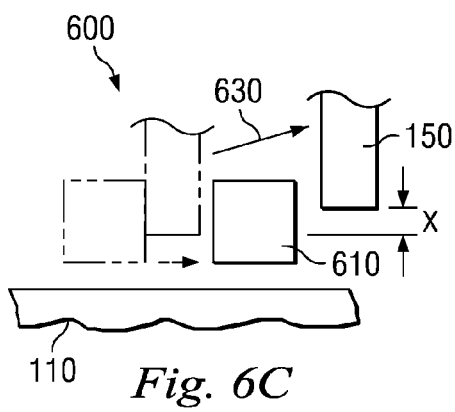
FIG. 6C is a side view of the apparatus shown in FIG. 6B.

Referring to FIG. 6C, illustrated is a sectional view of the apparatus 600 shown in FIG. 6B after the micro-mechanical end-effector 150 is translated in a second direction 630 relative to the substrate 110. The second direction 630 may comprise a first component that is substantially antiparallel to the first direction 620 and a second component that is substantially perpendicular to the first and direction 620, wherein the second component may also be substantially normal to the substrate 110. The translation of the micro-mechanical end-effector 150 represented in FIG. 6C may comprise a separate translation for each of the above-described first and second components. For example, the micro-mechanical end-effector 150 may first translate substantially antiparallel to the first direction 620 and subsequently translate substantially perpendicularly to the first direction 620 away from the substrate 110.

The translation of the micro-mechanical end-effector 150 represented in FIG. 6C may be at least sufficient to allow the micro-mechanical calibration member 610 to return to its neutral position shown in FIG. 6A, which may be determined by the feature detection apparatus described above. Contact between the micro-mechanical calibration member 610 and the micro-mechanical end-effector 150 may be maintained once the micro-mechanical calibration member 610 resumes its neutral position, although such contact may alternatively not be maintained. Moreover, the micro-mechanical calibration member 610 may not be permitted to return to its neutral position before the micro-mechanical end-effector 150 is translated substantially perpendicular to the first direction 620 away from the substrate 110.

Figure 6D:
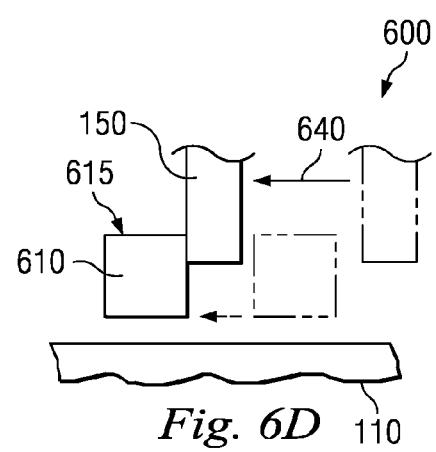
FIG. 6D is a side view of the apparatus shown in FIG. 6C.

Referring to FIG. 6D, illustrated is a sectional view of the apparatus 600 shown in FIG. 6C after the micro-mechanical end-effector 150 is translated in another direction 640, which may be substantially parallel to the first direction 620. Because, in the illustrated example, the vertical translation X of the micro-mechanical end-effector 150 represented in FIG. 6C was not sufficient to position the tip 155 beyond the upper edge 615 of the micro-mechanical calibration member 610 relative to the substrate 110, the micro-mechanical calibration member 610 will again be displaced in response to contact with the micro-mechanical end-effector 150 resulting from its translation in the direction 640.

Figure 6E:
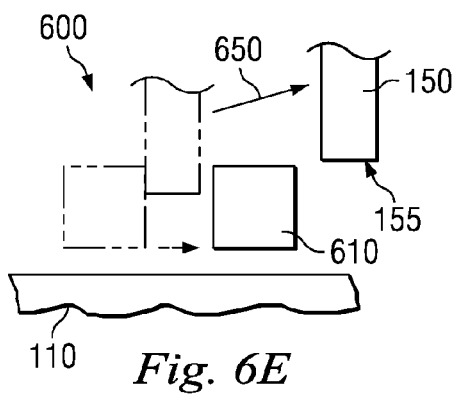
FIG. 6E is a side view of the apparatus shown in FIG. 6D.

Referring to FIG. 6E, illustrated is a sectional view of the apparatus 600 shown in FIG. 6D after the micro-mechanical end-effector 150 is translated in another direction 650, which may be substantially parallel to the direction 630. As with the translation of the micro-mechanical end-effector 150 in the direction 630, the translation in the direction 650 may comprise multiple translations, possibly in substantially orthogonal directions.

Figure 6F:
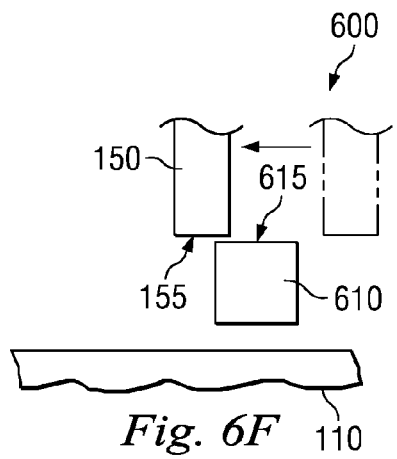
FIG. 6F is a side view of the apparatus shown in FIG. 6E.

This process of translating the micro-mechanical end-effector 150 parallel to the first direction 620 to contact the micro-mechanical calibration member 610 and subsequently translating the micro-mechanical end-effector 150 in a second direction at least comprising a component that is substantially perpendicular to the first direction 620 may be repeated until the translation parallel to the first direction 620 does not displace the micro-mechanical calibration member 610, as shown in FIG. 6F. Because the upper edge 615 of the micro-mechanical calibration member 610 relative to the substrate 110 is predetermined or otherwise known, the vertical location of the micro-mechanical end-effector 150 relative to the substrate 110 may be determined once lateral translation of the micro-mechanical end-effector 150 does not deflect the micro-mechanical calibration member 610.

The second direction 630 in which the micro-mechanical end-effector 150 is translated may include a component that is substantially perpendicular to and towards the substrate 110, in contrast to away from the substrate 110 as in the embodiments described above. The initial positioning of the micro-mechanical end-effector 150 may include positioning the tip 155 of the micro-mechanical end-effector 150 further away from the substrate 110 than the upper edge 615 of the micro-mechanical calibration member 610. Consequently, the initial translation of the micro-mechanical end-effector 150 in the first direction 620 may not deflect the micro-mechanical calibration member 610. Thereafter, the micro-mechanical end-effector 150 may be alternately translated in the first and second directions until translation in the first direction deflects the micro-mechanical calibration member 610, thus determining the vertical location of the micro-mechanical end-effector 150 relative to the substrate 110.

Figure 7:
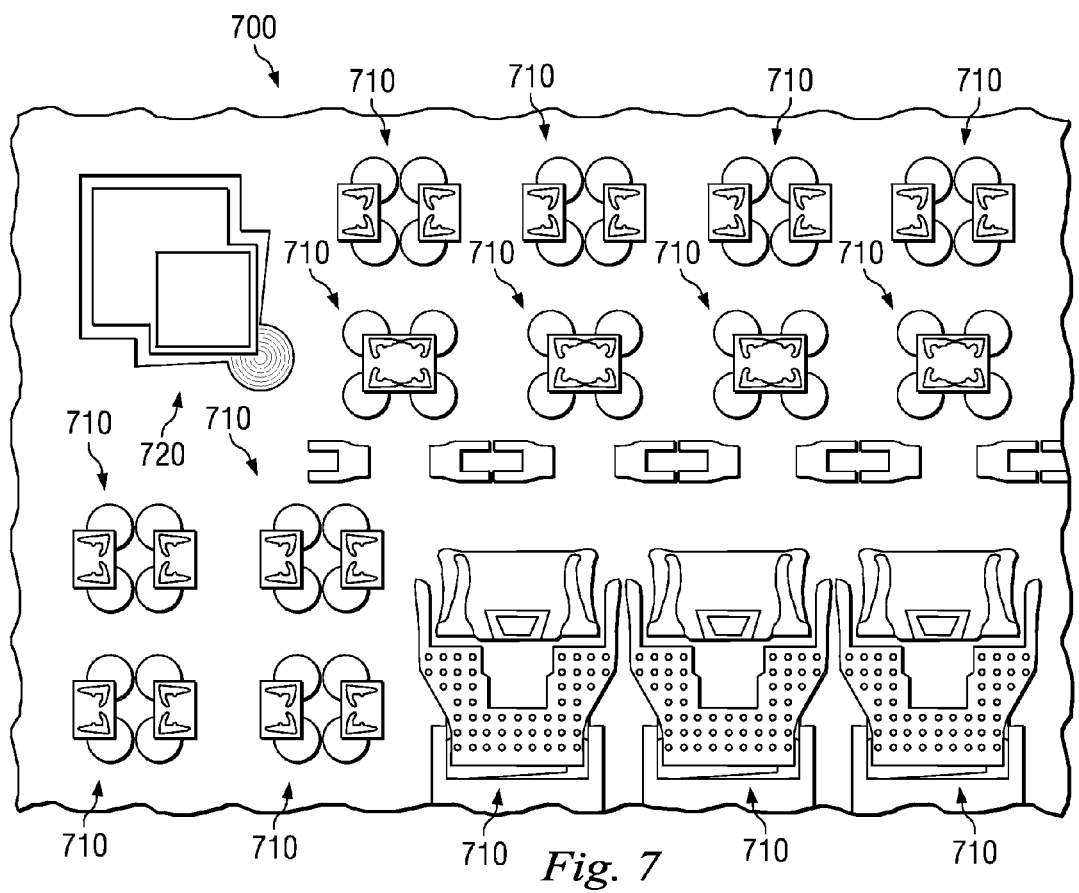
FIG. 7 is a top view of at least a portion of an apparatus according to aspects of the present disclosure.

Referring to FIG. 7, illustrated is a top view of at least a portion of an apparatus 700 according to aspects of the present disclosure. The apparatus 700 may be integral to, assembled with, or otherwise form at least a portion of a micro-mechanical device. The apparatus includes a plurality of micro-mechanical devices 710 and one or more micro-mechanical calibration members 720. The illustrated micro-mechanical calibration member 720 is depicted as being substantially similar to the micro-mechanical calibration member 510 shown in FIG. 5. However, the one or more of the micro-mechanical calibration members 720 may also or alternatively be substantially similar to one or more of the other micro-mechanical calibration members described herein.

The apparatus 700 and/or its components may have at least one feature dimension other than thickness that is less than about 50 microns. The apparatus 700 and/or its components may alternatively, or additionally, have at least one feature dimension other than thickness that is less than about 25 microns. The apparatus 700 and/or its components may alternatively, or additionally, have at least one feature dimension other than thickness that is less than about 1000 nm.

The apparatus 700 may be or comprise a die or chip on which the micro-mechanical devices 710 and the micro-mechanical calibration member 720 may be formed. Consequently, the orientations of each of the micro-mechanical devices 710 relative to the micro-mechanical calibration member 720 may be predetermined or otherwise known. By employing the micro-mechanical calibration member 720 according to one or more of the calibration aspects described herein, the position of a micro-mechanical end-effector 150 may be calibration and subsequently employed to interface and subsequently manipulate the micro-mechanical devices 710, such as to form a micro-mechanical assembly.

Figure 8:
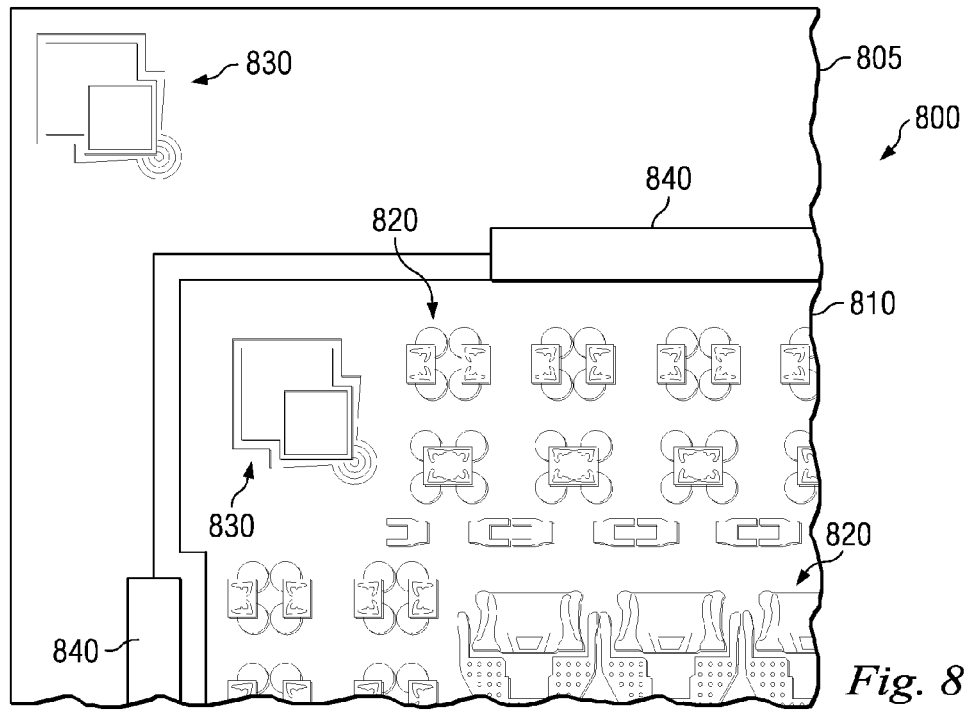
FIG. 8 is a top view of at least a portion of an apparatus according to aspects of the present disclosure.

Referring to FIG. 8, illustrated is a top view of at least a portion of an apparatus 800 according to aspects of the present disclosure. The apparatus 800 may be or include a positioning stage, substrate, or platform (hereafter collectively referred to as a stage) 805, including one that may be configured to position and possibly manipulate a die or chip 810 or another type of substrate or platform. For example, the die or chip 810 may be substantially similar to the apparatus 700 shown in FIG. 7. The die or chip 810 may include one or more micro-mechanical devices 820 which, for example, may be substantially similar to the micro-mechanical devices 710 shown in FIG. 7. The die or chip 810 may also include one or more micro-mechanical calibration members 830 which, for example, may be substantially similar to one or more of the micro-mechanical calibration members 120, 310, 410, 510, 610, or 720 described above, or be formed according to one or more aspects of one or more of such members.

The apparatus 800 and/or its components may have at least one feature dimension other than thickness that is less than about 50 microns. The apparatus 800 and/or its components may alternatively, or additionally, have at least one feature dimension other than thickness that is less than about 25 microns. The apparatus 800 and/or its components may alternatively, or additionally, have at least one feature dimension other than thickness that is less than about 1000 nm.

The apparatus 800 also includes a micro-mechanical calibration member 830 formed on, coupled to, or otherwise fixedly positioned relative to the stage 805. The micro-mechanical calibration member 830 may be substantially similar to one or more of the micro-mechanical calibration members 120, 310, 410, 510, 610, or 720 described above, or be formed according to one or more aspects of one or more of such members.

The apparatus 800 may also include one or more fixtures or other means 840 for securing the die or chip 810 to the stage 805 in a fixed position. The means 840 may include one or more brackets, clamps, and/or other mechanical fasteners, or other fasteners, including non-mechanical fasteners. The means 840 may include one or more stops against which the die or chip 810 may positioned, and the means 840 may also include vacuum means to secure the die or chip 810 in place against the stops.

In a calibration process according to aspects of the present disclosure, aspects of the above-described calibration processes may be executed with the micro-mechanical calibration member 830 to calibrate a micro-mechanical end-effector to the stage 805. Thereafter, aspects of the above-described calibration processes may be executed with one or more micro-mechanical calibration members 830 to calibrate the micro-mechanical end-effector to the die or chip 810.

Thus, the present disclosure provides an apparatus including a micro-mechanical calibration member having at least a portion that is elastically biasable away from a neutral position in response to mechanical contact. The apparatus may include a fixed member a micro-mechanical member that is biased to a neutral position and elastically deformable away from the neutral position in response to mechanical contact with a micro-mechanical contacting member. The micro-mechanical member may also be configured to receive the micro-mechanical contacting member, such as in a recess or opening. Accordingly, an apparatus according to aspects of the present disclosure may include a micro-mechanical apparatus having calibration means, wherein the calibration means includes an elastically deformable member.

The present disclosure also introduces an apparatus including a fixture configured to restrain movement of a micro-mechanical apparatus and a calibration member elastically deformable away from a neutral position. The neutral position may have a fixed orientation relative to the fixture and/or the micro-mechanical apparatus when the micro-mechanical apparatus is restrained by the fixture.

The present disclosure also provides a method including, for example: (1) contacting a micro-mechanical member with a micro-mechanical contacting member with sufficient force to elastically deform the micro-mechanical member; and (2) determining relative orientations of the micro-mechanical member and the micro-mechanical contacting member based on a predetermined amount of deformation of the micro-mechanical member from a neutral position when contacted by the micro-mechanical contacting member.

A method according to aspects of the present disclosure may include: (1) translating a micro-mechanical contacting member in a first direction with sufficient force to contact and elastically deform a micro-mechanical member; (2) translating the micro-mechanical contacting member in a second direction; and (3) alternating the translating in the first and second directions until translating the micro-mechanical contacting member in the first direction does not deform the micro-mechanical member. The translation of the micro-mechanical contacting member in the first direction may not initially deform the micro-mechanical member, and the second direction may include a component that is directed substantially towards the substrate, such that alternately translating the micro-mechanical contacting member may eventually deform the micro-mechanical member.

Aspects of two or more of the methods described herein may also be combined within the scope of the present disclosure. Also, any aspect of any method or apparatus described herein, whether described textually or graphically (in any of the figures) or otherwise, and whether described explicitly or implicitly or otherwise applicable to a specific embodiment of such method or apparatus, may also be applicable to other methods and/or apparatus described or illustrated herein or otherwise within the scope of the present disclosure.

The foregoing has outlined features of several embodiments and examples according to aspects of the present disclosure. Those skilled in the art should appreciate that they may readily use the present disclosure as a basis for designing or modifying other processes and structures for carrying out the same purposes and/or achieving the same advantages of the embodiments and examples introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
   a substrate;
   a first layer located on the substrate;
   a second layer located over the first layer; and
   calibration means, wherein the calibration means includes an elastically deformable member comprising at least a portion of the second layer and having at least one feature dimension other than thickness that is less than about 50 microns, wherein the elastically deformable member is elastically deformable in response to contact with a micro-mechanical end-effector having at least one feature dimension that is less than about 50 microns.

2. The apparatus of claim 1 wherein the elastically deformable member is displaceable between a neutral position and a deflected position.

3. The apparatus of claim 2 wherein the neutral position is a predetermined position relative to the substrate.

4. The apparatus of claim 1 wherein the calibration means includes a reference feature that is stationary relative to the substrate.

5. The apparatus of claim 4 wherein the elastically deformable member and the reference feature each include detection features by which an orientation of the elastically deformable member relative to the reference feature may be determined.

6. The apparatus of claim 5 wherein the detection features are edges of the elastically deformable member and the reference feature.

7. The apparatus of claim 1 further comprising a micro-mechanical device having a predetermined orientation relative to the calibration means, wherein the micro-mechanical device has at least one feature dimension other than thickness that is less than about 50 microns.

8. The apparatus of claim 1 further comprising a micro-mechanical device assembled to the substrate at a predetermined location relative to the calibration means, wherein the micro-mechanical device has at least one feature dimension other than thickness that is less than about 50 microns.

9. The apparatus of claim 1 further comprising a plurality of micro-mechanical devices each having a predetermined orientation relative to the calibration means, wherein at least one of the plurality of micro-mechanical devices has at least one feature dimension other than thickness that is less than about 50 microns.

10. The apparatus of claim 1 wherein the calibration means includes a plurality of elastically deformable members.

11. The apparatus of claim 1 wherein the calibration means includes a stationary portion coupled to the substrate by a portion of the first layer, the stationary portion being at least indirectly coupled to the elastically deformable member, and wherein a gap separates at least a portion of the elastically deformable member from the substrate such that at least a portion of the elastically deformable member is mobile relative to the substrate, the gap having a thickness substantially equal to at least about a thickness of the first layer.

12. The apparatus of claim 1 further comprising a micro-electro-mechanical device having a predetermined orientation relative to the substrate, wherein the micro-electro-mechanical device has at least one feature dimension other than thickness that is less than about 50 microns.

13. The apparatus of claim 1 further comprising a micro-electro-mechanical system having a predetermined orientation relative to the substrate, wherein the micro-electro-mechanical system has at least one feature dimension other than thickness that is less than about 50 microns.

14. The apparatus of claim 1 wherein:
   the elastically deformable member is elastically deformable between first and second orientations;
   the second orientation is angularly offset relative to the first orientation; and
   the angular offset is detectable by machine vision detection.

15. The apparatus of claim 1 further comprising a fixed member that is immobile relative to the substrate, wherein:
   the elastically deformable member is biased to a neutral position that is fixed relative to the fixed member;
   the elastically deformable member is configured to receive a micro-mechanical contacting member having at least one feature dimension that is less than about 50 microns; and
   the elastically deformable member is elastically deformable away from the neutral position in response to mechanical contact from the micro-mechanical contacting member.

16. The apparatus of claim 15 wherein:
   the fixed member includes a first detection enhancement feature; and
   the elastically deformable member includes a second detection enhancement feature;
   wherein a relative orientation of the first and second detection enhancement features is automatically detectable.

17. The apparatus of claim 16 wherein the first detection enhancement feature comprises an edge of the fixed member and the second detection enhancement feature is an edge of the elastically deformable member, wherein the first and second detection enhancement features each comprise a portion of a detection enhancement layer.

18. The apparatus of claim 16 wherein the relative orientation of the first and second displacement detection features is automatically detectable by visual imaging.

19. The apparatus of claim 15 wherein the elastically deformable member comprises a resilient member coupled to a displaceable member, wherein the resilient member has a first end that is fixed relative to the fixed member and a second end that is coupled to the displaceable member such that the displaceable member is elastically displaceable relative to the fixed member, wherein the displaceable member is configured to receive the micro-mechanical contacting member.

20. The apparatus of claim 15 wherein the micro-mechanical contacting member is a micro-mechanical end-effector having at least one feature dimension that is less than about 50 microns.

* * * * *